(12) United States Patent
Sikka et al.

(10) Patent No.: US 11,791,270 B2
(45) Date of Patent: Oct. 17, 2023

(54) DIRECT BONDED HETEROGENEOUS INTEGRATION SILICON BRIDGE

(71) Applicant: International Business Machines Corporation, Armonk, NY (US)

(72) Inventors: Kamal K Sikka, Poughkeepsie, NY (US); Maryse Cournoyer, Granby (CA); Pascale Gagnon, Brigham (CA); Charles C. Bureau, Bromont (CA); Catherine Dufort, Bromont (CA); Dale Curtis McHerron, Staatsburg, NY (US); Vijayeshwar Das Khanna, Millwood, NY (US); Marc A. Bergendahl, Rensselaer, NY (US); Dishit Paresh Parekh, Guilderland, NY (US); Ravi K. Bonam, Albany, NY (US); Hiroyuki Mori, Yasu (JP); Yang Liu, Yorktown Heights, NY (US); Paul S. Andry, Yorktown Heights, NY (US); Isabel De Sousa, Chambly (CA)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 17/315,859

(22) Filed: May 10, 2021

(65) Prior Publication Data
US 2022/0359401 A1 Nov. 10, 2022

(51) Int. Cl.
*H01L 23/538* (2006.01)
*H01L 21/48* (2006.01)
(Continued)

(52) U.S. Cl.
CPC ...... *H01L 23/5381* (2013.01); *H01L 21/4853* (2013.01); *H01L 21/4867* (2013.01);
(Continued)

(58) Field of Classification Search
CPC .................................................. H01L 23/5381
See application file for complete search history.

(56) References Cited

U.S. PATENT DOCUMENTS

| 5,847,929 A | 12/1998 | Bernier et al. |
| 6,255,208 B1 | 7/2001 | Bernier et al. |
| (Continued) | | |

FOREIGN PATENT DOCUMENTS

EP 3416188 A1 12/2018

OTHER PUBLICATIONS

Cheung et al., "Process Considerations of TC-NCP Fine-pitch Copper Pillar FC Bonding," 2012 14th International Conference on Electronic Materials and Packaging (EMAP), 7 pgs.
(Continued)

*Primary Examiner* — William A Harriston
(74) *Attorney, Agent, or Firm* — Kelli D. Morin

(57) ABSTRACT

A direct bonded heterogeneous integration (DBHi) device includes a substrate including a trench formed in a top surface of the substrate. The DBHi device further includes a first chip coupled to the substrate on a first side of the trench by a plurality of first interconnects. The DBHi device further includes a second chip coupled to the substrate on a second side of the trench by a plurality of second interconnects. The second side of the trench is arranged opposite the first side of the trench. The DBHi device further includes a bridge coupled to the first chip and to the second chip by a plurality of third interconnects such that the bridge is suspended in the trench. The DBHi device further includes a non-conductive paste material surrounding the plurality of third interconnects to further couple the bridge to the first chip and to the second chip.

17 Claims, 11 Drawing Sheets

(51) Int. Cl.
*H01L 23/13* (2006.01)
*H01L 25/065* (2023.01)
*H01L 23/00* (2006.01)

(52) U.S. Cl.
CPC .......... *H01L 23/13* (2013.01); *H01L 23/5386* (2013.01); *H01L 24/05* (2013.01); *H01L 24/13* (2013.01); *H01L 24/16* (2013.01); *H01L 24/17* (2013.01); *H01L 24/73* (2013.01); *H01L 24/81* (2013.01); *H01L 25/0655* (2013.01); *H01L 2224/0401* (2013.01); *H01L 2224/13147* (2013.01); *H01L 2224/16237* (2013.01); *H01L 2224/16257* (2013.01); *H01L 2224/1703* (2013.01); *H01L 2224/73204* (2013.01); *H01L 2224/81203* (2013.01); *H01L 2924/1616* (2013.01); *H01L 2924/1632* (2013.01); *H01L 2924/3512* (2013.01)

(56) References Cited

U.S. PATENT DOCUMENTS

| | | | |
|---|---|---|---|
| 6,268,739 | B1 | 7/2001 | Bernier et al. |
| 6,479,093 | B2 | 11/2002 | Lauffer et al. |
| 6,559,666 | B2 | 5/2003 | Bernier et al. |
| 7,816,793 | B2 | 10/2010 | Krishnamoorthy et al. |
| 8,008,764 | B2 | 8/2011 | Joseph et al. |
| 8,064,224 | B2 * | 11/2011 | Mahajan ................ H05K 1/142 361/762 |
| 8,227,904 | B2 * | 7/2012 | Braunisch ............... H01L 24/14 257/777 |
| 9,330,946 | B1 | 5/2016 | Farooq et al. |
| 9,357,646 | B2 | 5/2016 | Lee et al. |
| 9,368,450 | B1 * | 6/2016 | Gu ...................... H01L 23/5385 |
| 9,373,559 | B2 | 6/2016 | Brofman et al. |
| 9,653,428 | B1 * | 5/2017 | Hiner ..................... H01L 24/96 |
| 9,860,996 | B2 | 1/2018 | Interrante et al. |
| 9,865,569 | B2 | 1/2018 | Dang et al. |
| 9,875,986 | B2 | 1/2018 | Sakuma et al. |
| 9,941,207 | B2 | 4/2018 | Lin |
| 10,192,810 | B2 | 1/2019 | Karhade et al. |
| 10,580,738 | B2 | 3/2020 | Sikka et al. |
| 11,315,881 | B1 * | 4/2022 | Ho ...................... H01L 21/4853 |
| 11,557,541 | B2 * | 1/2023 | Hossain .............. H01L 23/5386 |
| 2002/0076909 | A1 | 6/2002 | Matsuki et al. |
| 2010/0327424 | A1 * | 12/2010 | Braunisch ............... H01L 24/73 257/692 |
| 2012/0261838 | A1 | 10/2012 | Braunisch et al. |
| 2014/0295618 | A1 | 10/2014 | Kim et al. |
| 2015/0364422 | A1 * | 12/2015 | Zhai ..................... H01L 21/768 257/773 |
| 2016/0343666 | A1 * | 11/2016 | Deshpande ......... H01L 23/5383 |
| 2017/0162509 | A1 | 6/2017 | Roy et al. |
| 2018/0040548 | A1 * | 2/2018 | Kim ................... H01L 21/4857 |
| 2019/0164806 | A1 | 5/2019 | Eobandung |
| 2019/0295952 | A1 | 9/2019 | Sikka et al. |
| 2020/0243448 | A1 | 7/2020 | Qian et al. |
| 2020/0395301 | A1 | 12/2020 | Li et al. |

OTHER PUBLICATIONS

Juang et al., "The development of high through-put micro-bump-bonded process with non-conductive paste (NCP)," 2012 7th International Microsystems, Packaging, Assembly and Circuits Technology Conference (IMPACT), https://ieeexplore.ieee.org/document/6420280, pp. 114-118.

Kim, "The effect of solder wetting on nonconductive adhesive (NCA) trapping in NCA applied flip-chip bonding," (abstract only), https://link.springer.com/article/10.1007/s10854-016-4611-5, accessed Jan. 27, 2021, 5 pgs.

Lau, J. "Heterogeneous Integrations on Silicon Substrates (Bridges)," In Heterogeneous Integrations, © Springer Nature, Singapore, 2019, pp. 113-139.

Shidong et al., "Chip Corner Guard for Chip-Package Interaction Failure Mitigation," U.S. Appl. No. 16/750,270, filed Jan. 23, 2020.

Takeda et al., "Development of a Novel Thermal Compression Flip Chip Bonding with Pre-Applied NCF Underfill," 2012 2nd IEEE CPMT Symposium Japan, 4 pgs.

Notification of Transmittal of the International Search Report and the Written Opinion of the International Searching Authority, or the Declaration, International Application No. PCT/EP2022/061329, Feb. 27, 2023, 27 pgs.

* cited by examiner

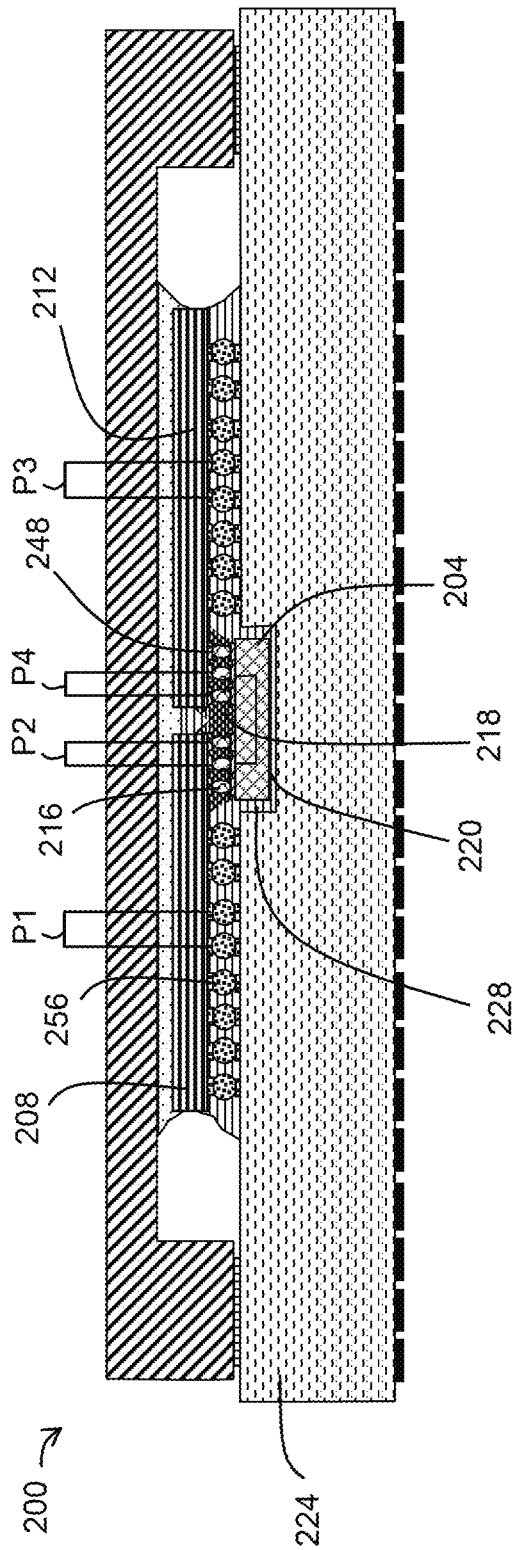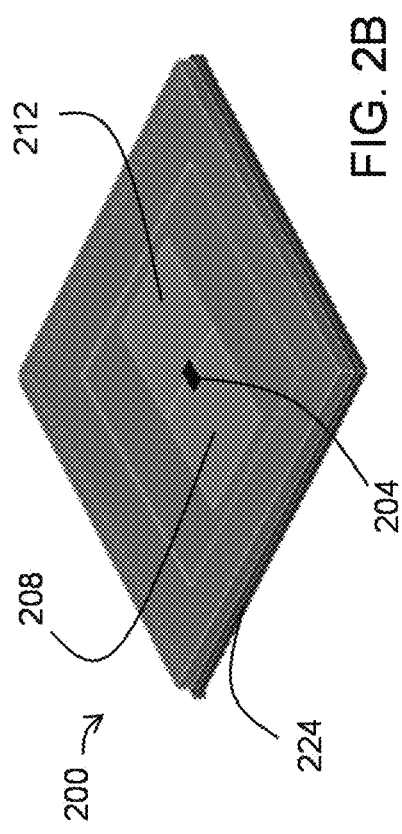

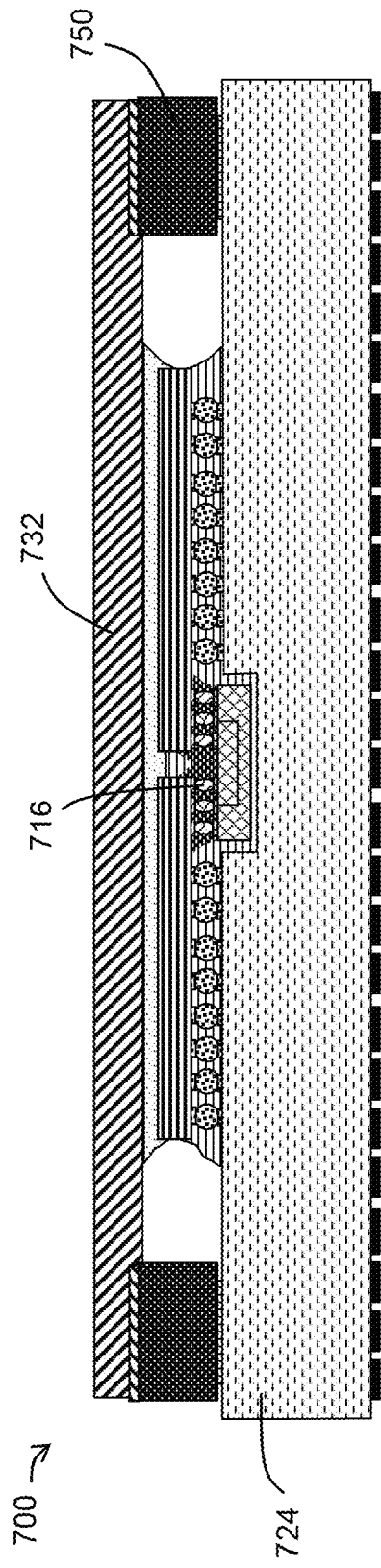
FIG. 7A
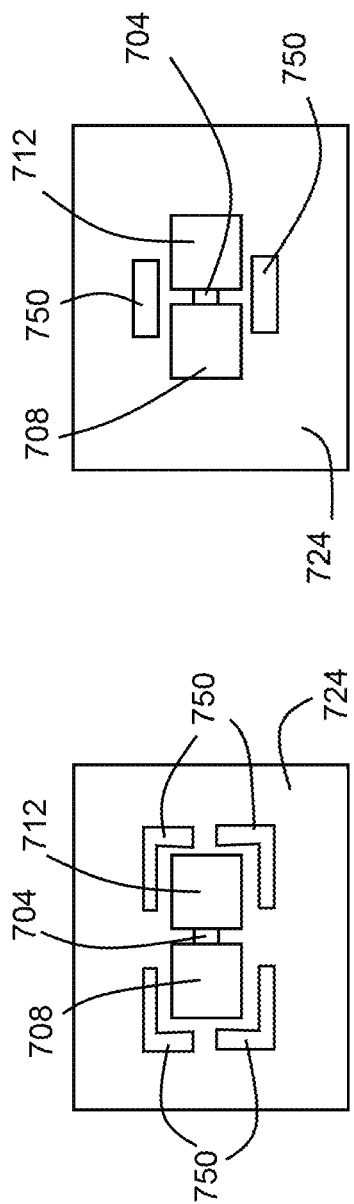
FIG. 7D
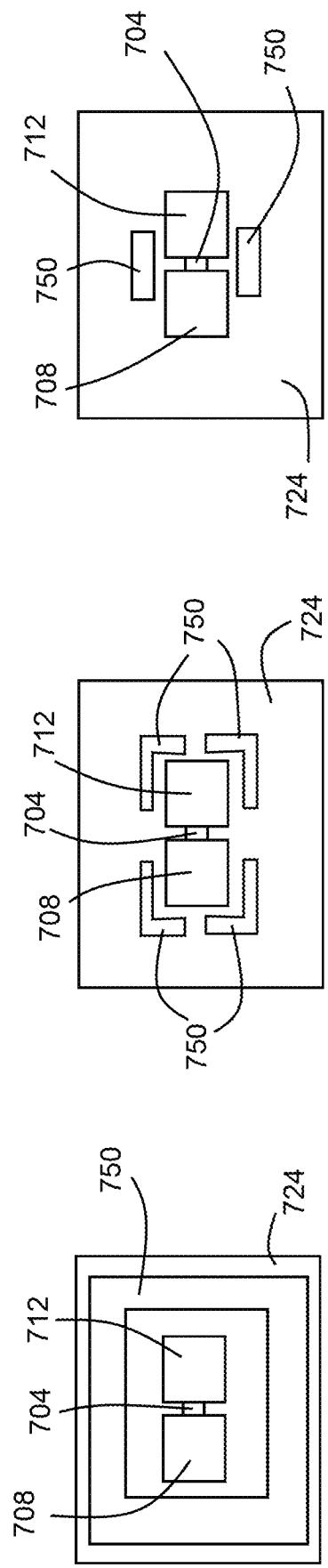
FIG. 7C
FIG. 7B

DIRECT BONDED HETEROGENEOUS INTEGRATION SILICON BRIDGE

BACKGROUND

The present disclosure relates to microchip electronic package fields. In particular, the present disclosure relates to direct bonded heterogeneous integration packaging technology and methods of manufacturing the same.

A semiconductor device is an electronic component that relies on the electronic properties of a semiconductor material (primarily silicon, germanium, or gallium arsenide, as well as organic semiconductors) for its function. Semiconductor devices are manufactured both as single discrete devices and as integrated circuit (IC) chips. IC chips consist of two or more (up to hundreds or even billions) semiconductor devices manufactured and interconnected on a single semiconductor wafer. Flip chip, also known as controlled collapse chip connection or its abbreviation, C4, is a method for interconnecting semiconductor devices, such as IC chips and microelectromechanical systems (MEMS), to external circuitry with solder bumps that have been deposited onto the chip pads.

SUMMARY

Embodiments of the present disclosure include a direct bonded heterogeneous integration (DBHi) device. The direct bonded heterogeneous integration (DBHi) device includes a substrate including a trench formed in a top surface of the substrate. The DBHi device further includes a first chip coupled to the substrate on a first side of the trench by a plurality of first interconnects. The DBHi device further includes a second chip coupled to the substrate on a second side of the trench by a plurality of second interconnects. The second side of the trench is arranged opposite the first side of the trench. The DBHi device further includes a bridge coupled to the first chip and to the second chip by a plurality of third interconnects such that the bridge is suspended in the trench. The DBHi device further includes a non-conductive paste material surrounding the plurality of third interconnects to further mechanically couple the bridge to the first chip and to the second chip.

Additional embodiments of the present disclosure include a direct bonded heterogeneous integration (DBHi) device including a substrate, a first chip coupled to the substrate by a plurality of first interconnects, a second chip coupled to the substrate by a plurality of second interconnects, and a bridge coupled to the first chip and to the second chip by a plurality of third interconnects. Each of the plurality of first interconnects is separated from one another by a first pitch. Each of the plurality of third interconnects is separated from one another by a third pitch. The first pitch is different than the third pitch.

Additional embodiments of the present disclosure include a method of forming a direct bonded heterogeneous integration (DBHi) device. The method includes joining a bridge to a first chip and joining the bridge to a second chip. Joining the bridge to the first chip includes dispensing a non-conductive paste on the first chip, thermocompression bonding the bridge to the first chip, and curing the non-conductive paste on the first chip. Joining the bridge to the second chip includes dispensing a non-conductive paste on the second chip, thermocompression bonding the bridge to the second chip, and curing the non-conductive paste on the second chip. Joining the bridge to the first chip and to the second chip forms a bridge-chip sub-assembly.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 2A is a schematic cross-section view of an example configuration of a direct bonded heterogeneous integration (DBHi) silicon bridge package, in accordance with embodiments of the present disclosure.

FIG. 2B is a schematic diagram depicting a top perspective view of the DBHi silicon bridge package shown in FIG. 2A, in accordance with embodiments of the present disclosure.

FIG. 7A is a schematic cross-section view of a DBHi silicon bridge package, in accordance with embodiments of the present disclosure.

FIG. 7B is a schematic top view of a DBHi silicon bridge package, such as that shown in FIG. 7A, in accordance with embodiments of the present disclosure.

FIG. 7C is a schematic top view of a DBHi silicon bridge package, such as that shown in FIG. 7A, in accordance with embodiments of the present disclosure.

FIG. 7D is a schematic top view of a DBHi silicon bridge package, such as that shown in FIG. 7A, in accordance with embodiments of the present disclosure.

DETAILED DESCRIPTION

Figure 1:
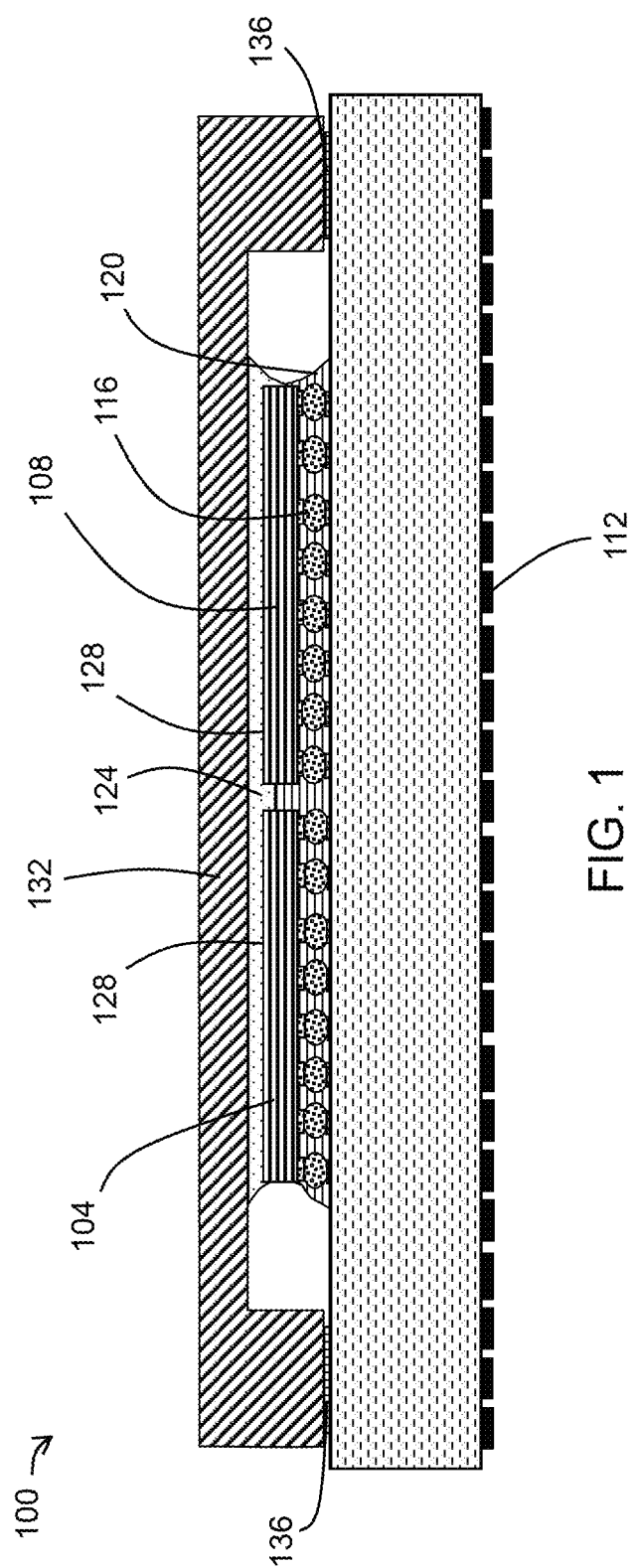
FIG. 1 is a schematic cross-section view of a multi-flip chip electronic package, in accordance with embodiments of the present disclosure.

Aspects of the present disclosure relate generally to microchip electronic package fields. In particular, the present disclosure relates to direct bonded heterogeneous integration packaging technology and methods of manufacturing the same. In accordance with at least one embodiment of the present disclosure, such a direct bonded heterogeneous integration package can be used in configurations with multi-chip modules. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Turning now to an overview of technologies that are more specifically relevant to aspects of the present disclosure, in general, ICs are put into protective packages to allow easy handling and assembly onto printed circuit boards and to protect the devices from damage. In flip chip systems, the IC is connected by solder bumps to a substrate.

As the benefit of transistor scaling decreases, heterogeneously integrated multi-chip packages enable increasing the bandwidth and reducing the latency of data transfer. Such packages especially facilitate artificial intelligence (AI) workloads that require high-speed communication at low-power dissipation per communication bit. Examples of such packages include Si-interposer, high-density laminate, bridge, 3D, and fan-out packages.

FIG. 1 depicts a schematic cross-sectional view of a multi-flip chip electronic package 100 including two semiconductor chips 104 and 108. The semiconductor chips 104 and 108 are attached to a chip-carrier laminate substrate 112 by C4 or Cu-pillar interconnects 116. The interconnects 116 are underfilled with a filled-epoxy material 120 to reduce mechanical stresses on the chips 104, 108, back end of line (BEOL), and on the interconnects 116. A thermal interface material 124 is arranged between the tops 128 of the chips 104, 108 and a lid 132. The lid 132 dissipates heat generated by the package 100 and is also attached to a top periphery of the laminate substrate 112 with an adhesive 136.

In electronic packages such as that illustrated by package 100, typical interconnect pitch for processor chips is between approximately 130 micrometers and approximately 150 micrometers. As used herein, the term pitch refers to the spacing from center to center of the interconnect structure. Communication between the chips 104, 108 occurs though the laminate substrate 112 where metal line widths and spacings are between approximately 15 micrometers and approximately 20 micrometers and the length of wires is approximately a few millimeters. Additionally, typical standard laminate technology is also limited to having interconnect pitches larger than approximately 100 micrometers. With the advent of finer pitches, such as approximately 55 micrometers, in high-bandwidth memory chips (HBM), alternate packaging schemes involving high-density laminates and silicon interposer packages have been developed.

In an example high-density laminate package, a thin film patch with line widths and spacings of approximately 2 micrometers is bonded to the top of a standard laminate surface. Fine pitch pads on the top of the laminate enable attachment of field-programmable gate arrays (FPGA), HBM, and accelerator chips with high-bandwidth interconnections.

In a silicon interposer package, the chips are mounted on a thinned silicon interposer substrate which is, in turn, mounted on a laminate substrate. Signal communication between the chips occurs directly through redistribution layers in the interposer while power is supplied to the chips by through-silicon vias (TSVs). The remaining structure of a silicon interposer package resembles that of a laminate flip chip package.

Fabrication of silicon interposers begins in a semiconductor fabrication plant where the TSVs are etched, seeded, plated, and revealed at the wafer level. Subsequently, wafer finishing and interconnect (C4 or Cu pillar) processing may occur in a semiconductor fabrication plant or at an outsourced semiconductor assembly and testing (OSAT) facility. Multiple methods may be used to integrate silicon interposers into packages.

Silicon interposers span the entire surfaces of the chips mounted thereon. Additionally, there is an increasing requirement of integrating multiple chips on the same silicon interposer. Accordingly, stitching across multiple reticle fields is required. Increasing size of the silicon interposers leads to a reduction in the number of interposers that can be obtained from a single wafer. Thus, given its complex wafer processing, the cost of a silicon interposer package can be significantly higher than that of a laminate flip chip package.

Silicon bridges may circumvent some of the issues with silicon interposers. Embedded multi-chip interconnect bridge (EMIB) technology provides silicon bridges that are embedded in the laminate substrate as part of the laminate build-up process. Fan-out embedded bridge (FOEB) technology provides a bridge embedded in a mold compound with redistribution layers and interconnects. Omni-directional interconnect (ODI) technology introduces a bridge joined to pads inside a trench in the laminate substrate and then joined with additional solder interconnects to top chips which are, in turn, joined to the top surface of the laminate substrate. TSVs connect the bottom and top pads of the bridge. Assembly sequences are described; however, vertical tolerances need to be tightly controlled.

It is apparent that simpler low-cost, low-power, high-bandwidth and low-latency packaging solutions are desirable to offset the reduced benefit of silicon transistor scaling. Embodiments of the present disclosure may overcome drawbacks of current solutions, including those discussed above, by using an interconnect bridge technology as disclosed herein. More specifically, the Direct Bonded Heterogeneous Integration (DBHi) technology disclosed herein may provide or enable simpler low-cost, low-power, high-bandwidth, and low-latency packaging solutions.

DBHi refers to a packaging technology wherein a Si-bridge is directly bonded to and in between processor chips using Cu pillars, allowing high-bandwidth, low-latency, low-power communication between the chips. Disclosed in further detail below are a DBHi package, an initial electrical and mechanical feasibility analysis, test vehicle design, bond and assembly process, detailed mechanical and thermal analyses, and reliability demonstration.

The DBHi technology is different from EMIB because the bridge is not embedded inside the laminate substrate. The DBHi technology is different from FOEB because it does not require embedding bridges inside mold compounds with redistribution layers (RDLs). The DBHi technology is different from ODI due to its simpler assembly process.

Schematic views of a DBHi package 200 are shown in FIGS. 2A and 2B. In particular, FIG. 2A shows a schematic cross-sectional view of the DBHi package 200, and FIG. 2B shows a schematic semi-transparent isometric view of the DBHi package 200. The DBHi package 200 is similar to the multi-flip chip electronic package 100, described above with reference to FIG. 1. For example, the DBHi package 200 includes main chips 208, 212 that may be substantially similar to the chips 104 and 108 of the package 100. The DBHi package 200 also includes a laminate substrate 224 that may be substantially similar to the laminate substrate 112 of the package 100. The DBHi package 200 is different from the multi-flip chip electronic package 100, however, in the ways discussed below.

In particular, the DBHi package 200 includes a bridge 204 that is directly connected to a first main chip 208 and a second main chip 212. In accordance with at least one embodiment of the present disclosure, the bridge 204 can be made of silicon or another semiconductor material. In accordance with at least one alternative embodiment of the present disclosure, the bridge 204 can be made of a glass, an organic laminate, or a silicon bridge with one or more organic redistribution layers on top of the bridge in polyimide or other thin film layers. In accordance with at least one alternative embodiment of the present disclosure, the bridge 204 itself can be a chip.

The bridge 204 is connected to each of the main chips 208, 212 by interconnects. More specifically, the bridge 204 is connected to the main chips 208, 212 by Cu pillars 216 encapsulated in a non-conductive paste (NCP) material 218. In accordance with at least one embodiment of the present disclosure, the NCP material 218 can be a non-conductive film (NCF). The main chips 208, 212 are attached to the bridge 204 such that an end face of the first main chip 208 is arranged substantially parallel to an end face of the second main chip 212, and the end faces are separated from each other by a relatively small gap. Thus, the main chips 208, 212 do not contact one another directly, but are connected to one another via the bridge 204.

The main chips 208, 212 are coupled to the substrate 224 such that the bridge 204 is suspended by the main chips 208, 212 in a trench 220 formed in the substrate 224. In other words, the bridge 204 does not directly contact the substrate 224. More specifically, the first main chip 208 is coupled to the substrate 224 on a first side of the trench 220 by a first plurality interconnects 256, and the second main chip 212 is coupled to the substrate 224 on a second side of the trench 220 by a second plurality of interconnects 256. The first side of the trench 220 is opposite the second side of the trench 220. In accordance with at least one alternative embodiment of the present disclosure, the substrate 224 may not necessarily include a trench. In such embodiments, the bridge 204 is suspended by the main chips 208, 212 in another manner such that the bridge 204 does not directly contact the substrate 224.

The trench 220 is formed in a top surface of the laminate substrate 224. In accordance with at least one embodiment of the present disclosure, the trench 220 can be machined in the top surface of the laminate substrate 224. The trench 220 is formed such that it is located in the laminate layers of the laminate substrate 224 and such that the bottom of the trench 220 is above a core of the laminate substrate 224. In other words, the trench 220 is formed such that the conductor layer of the laminate substrate 224 is not exposed.

A chip underfill 228 is used to fill the remainder of the trench 220 via capillary action, and the chip underfill 228 anchors the bottom of the bridge 204 to the laminate substrate 224. The remainder of the structure of the DBHi package 200 is substantially the same as that of a dual flip-chip package such as, for example, package 100 shown in FIG. 1.

Figure 3:
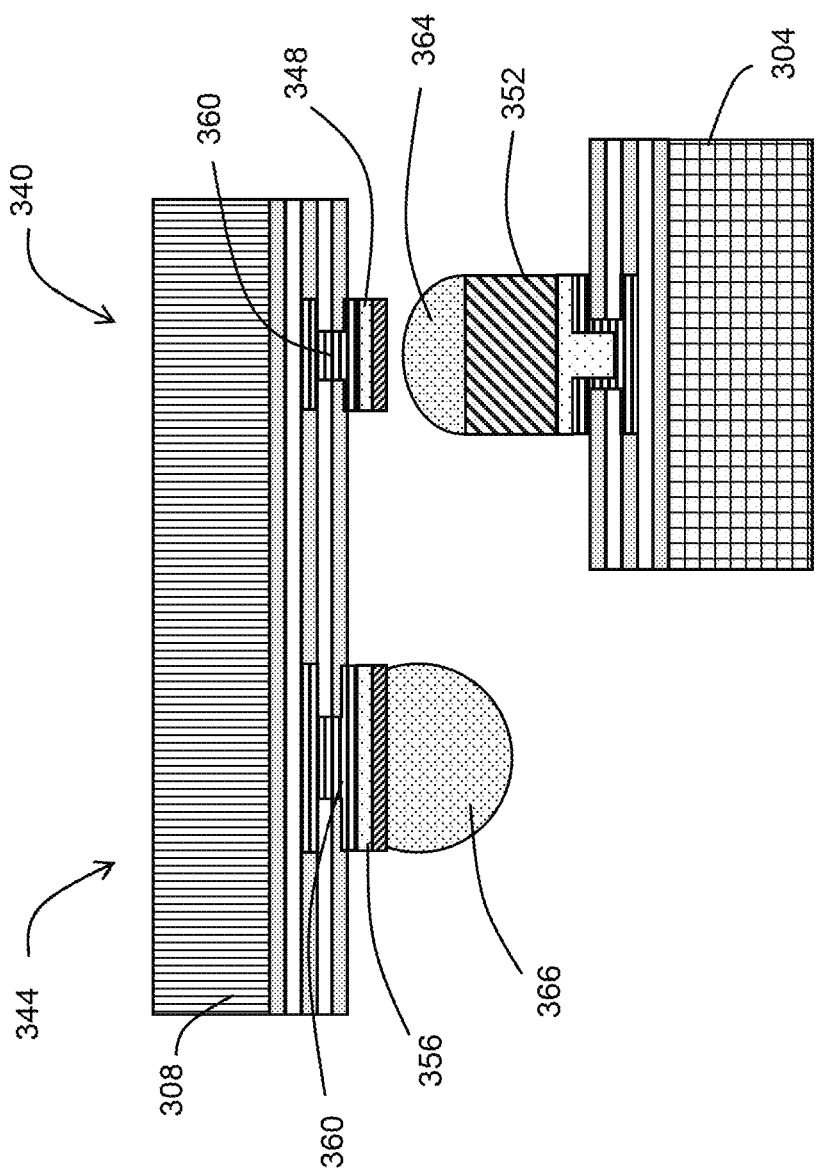
FIG. 3 is a schematic cross-section view of a portion of a DBHi silicon bridge package, in accordance with embodiments of the present disclosure.

FIG. 3 shows a schematic cross-sectional view of a portion of a bridge 304 and a main chip 308. The bridge 304 and the main chip 308 can be illustrative of, for example, the bridge 204 and the main chip 208 shown in FIGS. 2A and 2B. The main chip 308 is shown for illustrative purposes only and therefore can be representative of any main chip that is connected to the bridge 304.

FIG. 3 illustrates a separated under bump metallization (UBM) structure, which facilitates formation of the disclosed DBHi package and eliminates the need for tight tolerance control. More specifically, as shown schematically in FIG. 3, the main chip 308 includes a bridge region 340 and a non-bridge region 344. The bridge region 340 refers to that portion of the main chip 308 that overlaps with the bridge 304, and the non-bridge region 344 refers to that portion of the main chip 308 that does not overlap with the bridge 304. For illustrative purposes, the portion of the main chip 308 shown in FIG. 3 includes one bridge region 340 and one non-bridge region 344. However, in accordance with at least some embodiments of the present disclosure, the main chip 308 may include more than one bridge region 340 and/or more than one non-bridge region 344.

In the bridge region 340, the main chip 308 includes mating pads 348 which are configured to align with corresponding Cu pillars 352 on the bridge 304. In contrast, in the non-bridge region 344, the main chip 308 includes interconnects 356 which are configured to join with the laminate substrate (not shown in FIG. 3) in the formation of the DBHi package. The interconnects 356 of the non-bridge region 340 of the main chip 308 are spaced with a coarser pitch than are the mating pads 348 of the bridge region 344. As mentioned above, pitch refers to the spacing from center to center of the structure. Thus, in other words, the spacing between the center of one interconnect 356 and the center of an adjacent interconnect 356 is larger than the spacing between the center of one mating pad 348 and the center of an adjacent mating pad 348.

This variation in spacing can be seen in the DBHi package 200 shown in FIG. 2A. As shown, the first chip 208 includes a pitch P1 between adjacent interconnects 256, which are joined with the laminate substrate 224, and a pitch P2 between mating pads 248, which are joined with the Cu pillars 216 of the bridge 204. Similarly, the second chip 212 includes a pitch P3 between adjacent interconnects 256, which are joined with the laminate substrate 224, and a pitch P4 between mating pads 248, which are joined with the Cu pillars 216 of the bridge 204. In the embodiment shown in FIG. 2A, the pitch P1 is approximately the same as the pitch P3, the pitch P2 is approximately the same as the pitch P4, and the pitches P1 and P3 are greater than the pitches P2 and P4.

In accordance with at least one alternative embodiment of the present disclosure, the pitch P1 can be different than the pitch P3 and/or the pitch P2 can be different than the pitch P4. In accordance with at least one alternative embodiment of the present disclosure, at least one of the pitches P2 and P4 can be substantially the same as at least one of the pitches P1 and P3. In other words, in various embodiments of the present disclosure, the pitches P1, P2, P3, and P4, and therefore the arrangement and connection of the bridge 204 relative to the chips 208, 212 and/or the laminate substrate 224, may be different and/or non-symmetrical in various portions of the DBHi package 200.

Returning to FIG. 3, each mating pad 348 and each interconnect 356 includes a corresponding UBM 360. As mentioned above, the pitch between the interconnects 356 is different than the pitch between the mating pads 248. Thus, the UBM arrangement in the non-bridge region 344 is different than the UBM arrangement in the bridge region 340 of the main chip 308. In other words, the main chip 308 includes more than one UBM arrangement. The main chip 308 may be referred to as having a separated UBM arrangement. As noted above, this type of separated UBM arrangement enables formation of the chips that are required for the DBHi package and eliminates the need for tight tolerance control.

In accordance with at least some embodiments of the present disclosure, the solder material 364 on the Cu pillars 352 of the bridge 304 is different from the solder material 366 on the interconnects 356 of the chip 308. In such embodiments, the different solder materials have different reflow temperatures. In alternative embodiments of the present disclosure, the solder materials 364, 366 can be the same material and thus have the same reflow temperature.

The structure of a DBHi package described herein allows for splitting large processor chips and interconnecting them with a high bandwidth connection, thereby increasing the yield of the processor chips. The performance specifications of DBHi technology are compared with a laminate substrate in the following table.

|  | DBHi | Laminate substrate |
| --- | --- | --- |
| Wire-ability @55 um C4 pitch | 400 IO/mm/layer | 171 IO/mm/layer |
| @40 um C4 pitch | 400 IO/mm/layer | 125 IO/mm/layer |
| @30 um C4 pitch | 400 IO/mm/layer | 66 IO/mm/layer |
| Noise Isolation | >28 dB up to 5 GHz | >14 dB up to 5 GHz |
| Power efficiency | 0.13 pJ/bit using simple IO interface around bridge | 3 pJ/bit |
| Insertion loss | <1.5 dB up to 5 GHz | <1.5 dB up to 5 GHz |
| Group Delay | <37 ps, 1 GHz < f < 5 GHz | <23 ps, 1 GHz < f < 5 GHz |

DBHi provides higher wire-ability, and the number of escaped JO/mm/layer is independent of the C4 pitch in the 55 to 30 micrometer range. With an allowance for shielding layers, the noise isolation for a DBHi package is also superior to that of a laminate substrate package. The power dissipation per communication bit for a DBHi package is estimated to be a magnitude of order better than the laminate substrate package. Thus, a DBHi package provides superior bandwidth, higher wire-ability, better noise isolation, and better power efficiency relative to a laminate substrate package. In particular, the realized bandwidth of a DBHi package can reach several terabits per second.

In accordance with at least one embodiment of the present disclosure, bridge wafers can be fabricated by a standard Cu pillar plating process. In accordance with at least one embodiment of the present disclosure, because the main chips require mating pads in the bridge regions and interconnects (such as C4s) in the non-bridge regions, a double lithography process can be used. In accordance with at least one embodiment of the present disclosure, the main chips can be 3-level structures including a line level, a via level, and a pad level. In accordance with at least some embodiments of the present disclosure, an injection molding soldering process can be used to create the larger interconnects (such as C4s) on the main chips.

In accordance with at least one embodiment of the present disclosure, the laminate substrate can be formed using a conventional organic laminate as the chip carrier. In accordance with at least one embodiment of the present disclosure, the laminate substrate size can be, for example, in a range of 25 millimeters to 125 millimeters. In a particular example, the laminate substrate size can be 68.5 millimeters by 68.5 millimeters. In accordance with at least one embodiment of the present disclosure, the laminate substrate trench size can be, for example, 3.9 millimeters by 2.75 millimeters. In accordance with at least one embodiment of the present disclosure, the chip size can be, for example, 19 millimeters by 19 millimeters. In accordance with at least one embodiment of the present disclosure, the bridge size can be, for example, in a range of 1 millimeter by 1 millimeter to 15 millimeters by 15 millimeters. In a particular example, the bridge size can be 3.2 millimeters by 2.5 millimeters. In another particular example, the bridge size can be 3.35 millimeters by 2.5 millimeters. In another particular example, the bridge size can be 3.5 millimeters by 2.5 millimeters.

In accordance with at least one embodiment of the present disclosure, the chip-chip spacing could be varied as, for example, 150 micrometers, 300 micrometers, and 450 micrometers. In embodiments wherein the chip-chip spacing is 150 micrometers, the bridge size can be, for example, 3.2 millimeters by 2.5 millimeters. In embodiments wherein the chip-chip spacing is 300 micrometers, the bridge size can be, for example, 3.35 millimeters by 2.5 millimeters. In embodiments wherein the chip-chip spacing is 450 micrometers, the bridge size can be, for example, 3.5 millimeters by 2.5 millimeters.

In accordance with at least one embodiment of the present disclosure, the length of the bridge can be determined depending on the desired chip-chip spacing, the distance to the last Cu pillar in the bridge region of the chip, and half the distance between the last Cu pillar and the first adjacent interconnect on the chip. More specifically, in such embodiments, the length of the bridge is approximately equal to the sum of the desired chip-chip spacing, the distance to each of the last Cu pillars in the bridge regions of the chips, and half the distance between each of the last Cu pillars and the first adjacent interconnect on the chips.

Figure 4:
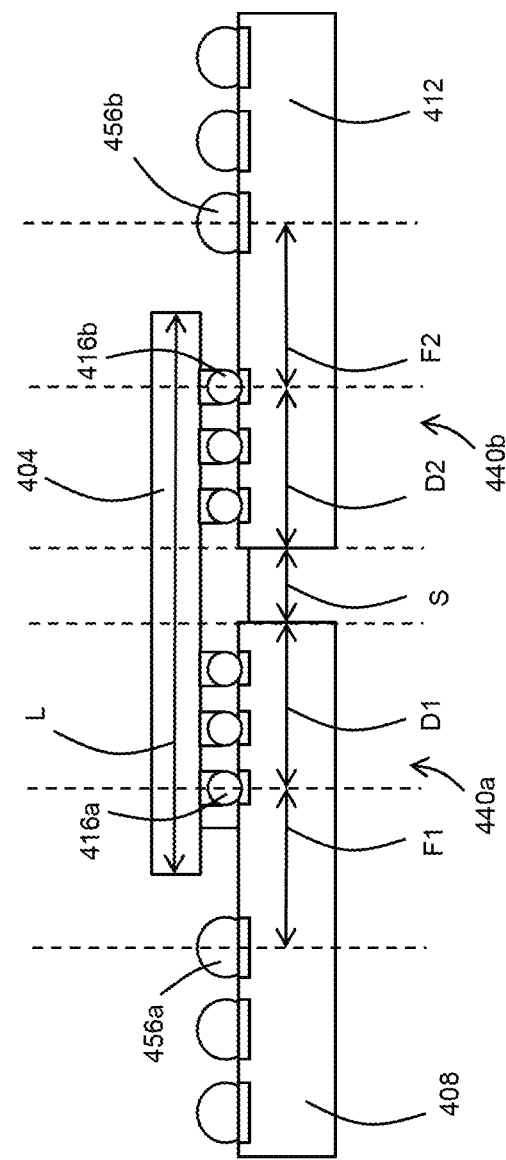
FIG. 4 is a schematic diagram depicting a portion of a DBHi silicon bridge package, in accordance with embodiments of the present disclosure.

For example, as shown in FIG. 4, the length L of the bridge 404 is the sum of the desired chip-chip spacing S between chip 408 and chip 412, the distances D1 and D2 from the edge of each chip to the respective last Cu pillar 416a and 416b in the bridge regions 440a and 440b of the chips 408 and 412, and half of each of the distances F1 and F2 between the last Cu pillars 416a and 416b and the first adjacent interconnects 456a and 456b on the chips 408 and 412.

In accordance with at least one embodiment of the present disclosure, the trench is in the center of the laminate substrate and is formed by mechanical drilling. As mentioned above, the depth of the trench is precisely controlled so as to not expose the conductor layer of the laminate substrate. In order for the bridge to be arranged within the trench and surrounded by underfill, the trench must be sized larger than the corresponding bridge. Accordingly, in embodiments wherein the bridge size is 3.2 millimeters by 2.5 millimeters, the trench size is larger than 3.2 millimeters by 2.5 millimeters. In embodiments wherein the bridge size is 3.35 millimeters by 2.5 millimeters, the trench size is larger than 3.35 millimeters by 2.5 millimeters. In embodiments wherein the bridge size is 3.5 millimeters by 2.5 millimeters, the trench size is larger than 3.5 millimeters by 2.5 millimeters.

In accordance with at least one embodiment of the present disclosure, subsequent to wafer fabrication, bridge wafers can be ground on tape to a specified thickness and then saw diced and picked. In accordance with at least one alternative embodiment, the bridge wafers can be laser diced instead of saw diced. In accordance with at least one embodiment of the present disclosure, a final bridge thickness can be, for example, 200 micrometers. In such embodiments, this final bridge thickness precludes the requirement of a wafer handler. In accordance with at least one embodiment of the present disclosure, a double dicing process can be used to achieve accurate bridge sizes.

Figure 5:
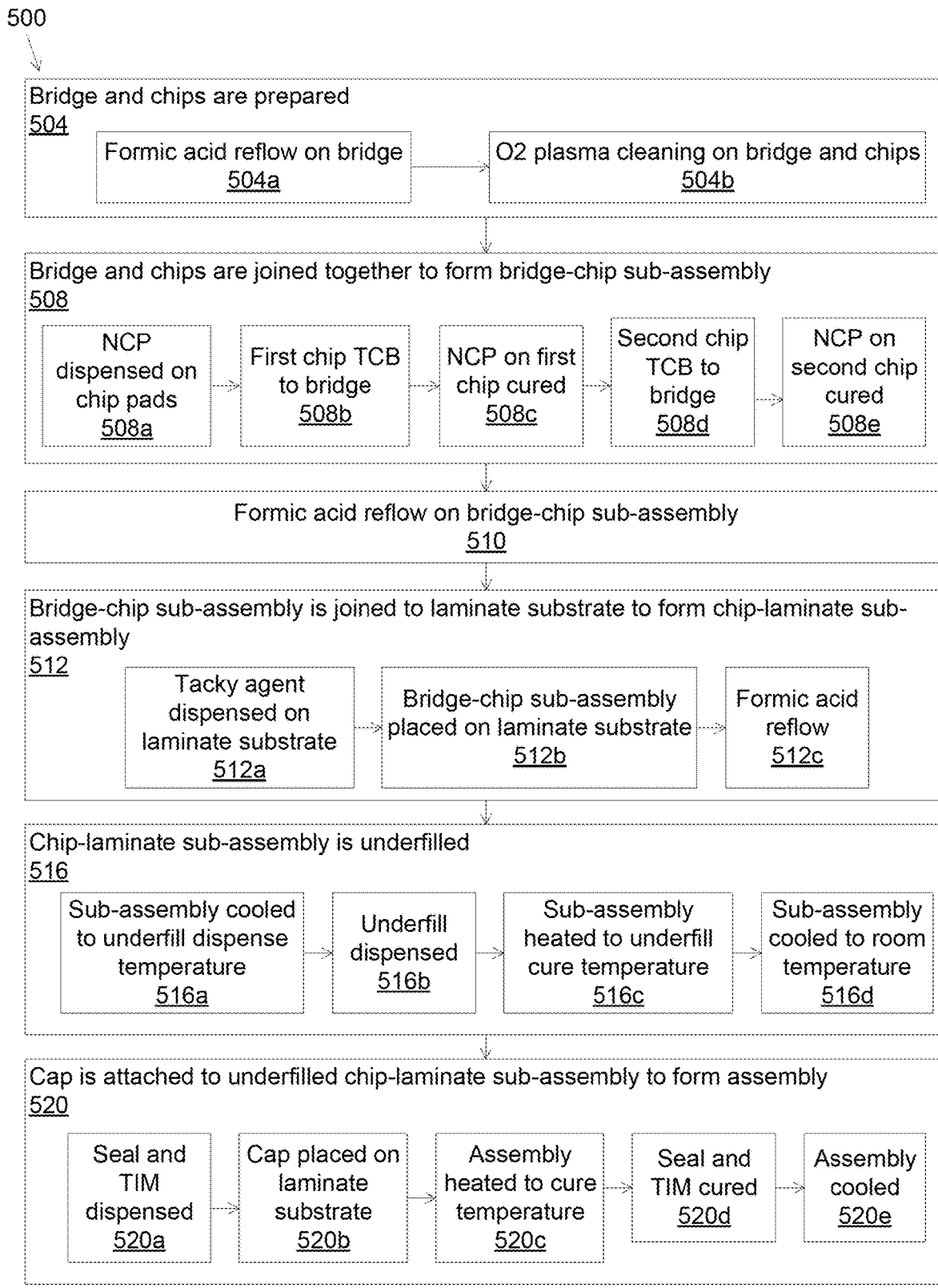
FIG. 5 depicts a flowchart of an example method of forming a DBHi silicon bridge package, in accordance with embodiments of the present disclosure.

Once the bridges, substrates, and chips have been formed, for example, in the manner described above, the chip-bridge sub-assembly can be formed, for example, using the method 500 shown in FIG. 5. The chip-bridge sub-assembly may also be referred to herein as a chip-bridge structure. The method 500 addresses challenges with respect to positional referencing which may arise due to the basic arrangement of the chip-bridge sub-assembly. The method 500 also addresses challenges with respect to structural fragility which may arise due to the small size of the bridge relative to the overlying main chips.

Figure 6A:
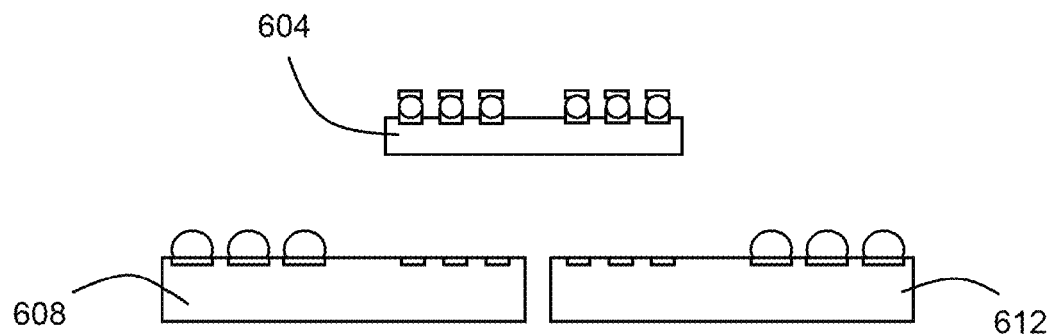
FIG. 6A is a schematic diagram depicting a DBHi silicon bridge package following the performance of a portion of the method shown in FIG. 5, in accordance with embodiments of the present disclosure.

Thus, FIG. 5 depicts an example method 500 for forming a chip-bridge sub-assembly which can be used in the above described DBHi package 200 shown in FIGS. 2A and 2B. The method 500 begins at operation 504, wherein a bridge and chips are prepared for forming a chip-bridge sub-assembly. In particular, operation 504 includes performing surface preparations on the bridge and chips. In accordance with at least one embodiment of the present disclosure, operation 504 can include sub-operation 504a wherein a formic acid reflow is performed on the bridge. In accordance with at least one embodiment of the present disclosure, operation 504 can include sub-operation 504b wherein an O2 plasma cleaning is performed on the bridge and chips. FIG. 6A is a schematic drawing of the bridge 604 and chips 608, 612 following the performance of operation 504 of the method 500.

Figure 6B:
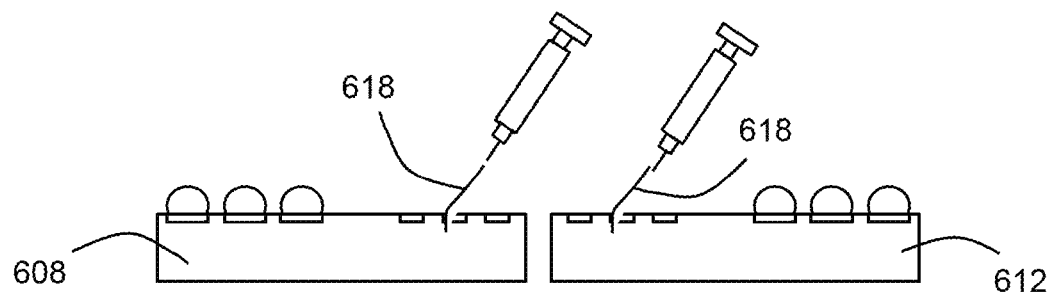
FIG. 6B is a schematic diagram depicting a DBHi silicon bridge package following the performance of a portion of the method shown in FIG. 5, in accordance with embodiments of the present disclosure.

At operation 508, the bridge and the chips are joined together. In accordance with at least one embodiment of the present disclosure, operation 508 can include sub-operation 508a, wherein non-conductive paste (NCP) is dispensed on pads of each of the chips 608, 612. FIG. 6B is a schematic drawing of the chips 608, 612 and the NCP 618 during the performance of sub-operation 508a in such embodiments.

In accordance with at least one embodiment of the present disclosure, operation 508 further includes sub-operation 508b, wherein the bridge is joined to a first chip by thermocompression bonding (TCB). More specifically, in such embodiments, the bridge is arranged relative to the first chip such that the Cu pillars on the bridge are aligned with the NCP on the pads of the first chip. Once so aligned, the bridge and the first chip are joined by TCB.

Figure 6C:
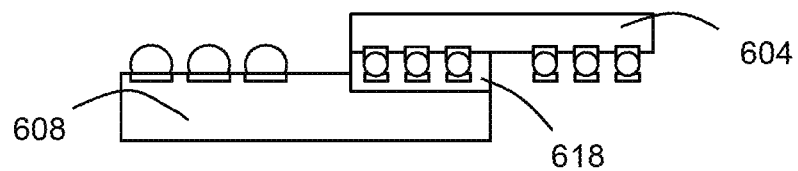
FIG. 6C is a schematic diagram depicting a DBHi silicon bridge package following the performance of a portion of the method shown in FIG. 5, in accordance with embodiments of the present disclosure.

In accordance with at least one embodiment of the present disclosure, following joining of the bridge and the first chip by TCB, operation 508 can further includes sub-operation 508c, wherein the NCP on the first chip is cured to further strengthen the connection between the bridge and the first chip. In accordance with at least one embodiment of the present disclosure, curing the NCP can take place at a temperature of, for example, between approximately 165° and approximately 185° Celsius. After joining the bridge and the first chip, the two together may be referred to as a bridge-first chip sub-assembly. FIG. 6C is a schematic drawing of the bridge 604 joined to chip 608 following joining the bridge to the first chip in the performance of operation 508.

Figure 6D:
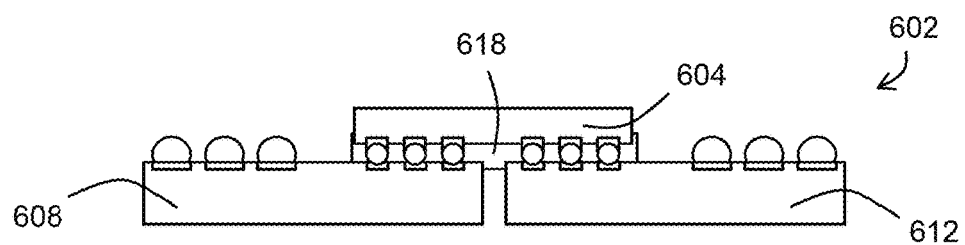
FIG. 6D is a schematic diagram depicting a DBHi silicon bridge package following the performance of a portion of the method shown in FIG. 5, in accordance with embodiments of the present disclosure.

In accordance with at least one embodiment of the present disclosure, operation 508 can further include sub-operations 508d and 508e wherein the bridge is joined to a second chip in substantially the same manner that the bridge was joined to the first chip in sub-operations 508b and 508c. In particular, in sup-operation 508d, the bridge is joined to the second chip by TCB followed, in sub-operation 508e, by curing the NCP on the second chip to further strengthen the connection between the bridge-first chip sub-assembly and the second chip. In accordance with at least one embodiment of the present disclosure, the NCP can be cured at a temperature of, for example, between approximately 165° and approximately 185° Celsius. After joining the bridge-first chip sub-assembly and the second chip, the two together may be referred to as a bridge-chip sub-assembly. In other words, once the bridge, the first chip, and the second chip have been joined together, they make up the bridge-chip sub-assembly. FIG. 6D is a schematic drawing of the bridge 604 joined to both chips 608 and 612 following joining the bridge-first chip sub-assembly and the second chip in the performance of operation 508. Accordingly, FIG. 6D depicts a bridge-chip sub-assembly 602 including the bridge 604 and the chips 608, 612.

At operation 512 of the method 500, the bridge-chip sub-assembly formed in the performance of operation 508 is joined to the laminate substrate. In accordance with at least some embodiments of the present disclosure, after the bridge-chip sub-assembly has been formed and before the bridge-chip sub-assembly is joined to the laminate substrate, a formic acid reflow is performed on the bridge-chip sub-assembly. In such embodiments, the formic acid reflow can be performed at a temperature of, for example, between approximately 245° and approximately 260° Celsius. In such embodiments, performing this formic acid reflow heals or corrects cracks or defects that arose in the NCP during the performance of operation 508. Accordingly, performing this formic acid reflow further strengthens the connection between the bridge and the chips in the bridge-chip sub-assembly.

In accordance with at least some embodiments of the present disclosure, performance of this formic acid reflow can be a sub-operation included in operation 508. In accordance with at least some alternative embodiments of the present disclosure, performance of this formic acid reflow can be a sub-operation included in operation 512. In accordance with at least some alternative embodiments of the present disclosure, as shown in the illustrative embodiment of FIG. 5, performance of this formic acid reflow can be a separate operation 510 performed after the performance of operation 508 and before the performance of operation 512.

Figure 6E:
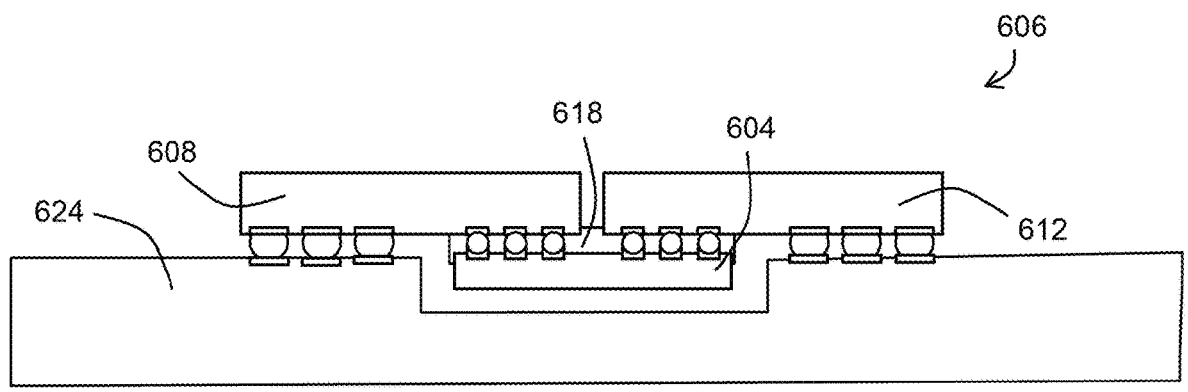
FIG. 6E is a schematic diagram depicting a DBHi silicon bridge package following the performance of a portion of the method shown in FIG. 5, in accordance with embodiments of the present disclosure.

In accordance with at least one embodiment of the present disclosure, joining the bridge-chip sub-assembly to the laminate substrate in operation 512 can include sub-operation 512a, wherein a tacky agent is dispensed on the laminate substrate. In accordance with at least one embodiment of the present disclosure, the tacky agent may be dispensed into a cavity or multiple cavities formed in the laminate substrate. In accordance with at least one embodiment of the present disclosure, operation 512 can further include sub-operation 512b, wherein the bridge-chip sub-assembly is placed on the laminate substrate such that the tacky agent joins the bridge-chip sub-assembly and the laminate substrate. Once the bridge-chip sub-assembly and the laminate substrate have been joined, the two together may be referred to as a chip-laminate sub-assembly. FIG. 6E is a schematic drawing of the bridge 604 and chips 608, 612 together with the laminate substrate 624 following performance of sub-operations 512a and 512b in such embodiments. Accordingly, FIG. 6E depicts a chip-laminate sub-assembly 606.

In accordance with at least one embodiment of the present disclosure, operation 512 can further include sub-operation 512c, wherein a formic acid reflow is performed on the chip-laminate sub-assembly. In such embodiments, the formic acid reflow prepares the surfaces of the chip-laminate sub-assembly for subsequent operations of the method 500.

At operation 516, the chip-laminate sub-assembly is underfilled. In other words, at operation 516, underfill material is used to fill the chip-laminate sub-assembly and further strengthen the chip-laminate sub-assembly. In accordance with at least one embodiment of the present disclosure, operation 516 can include sub-operation 516a, wherein the chip-laminate sub-assembly is cooled to an underfill dispense temperature following operation 512 and prior to dispensing the underfill material. In particular, the chip-laminate sub-assembly may be cooled to an underfill dispense temperature between approximately 90° and approximately 110° Celsius prior to dispensing the underfill material.

The underfill dispense temperature will depend on the particular material used for the underfill. Regardless of the material used for the underfill, the underfill dispense temperature is the highest temperature at which the viscosity of the underfill material is approximately 50% of its minimum value as a function of temperature. Accordingly, in such embodiments, cooling the chip-laminate sub-assembly to the underfill dispense temperature facilitates the capillary action of the underfill material.

Figure 6F:
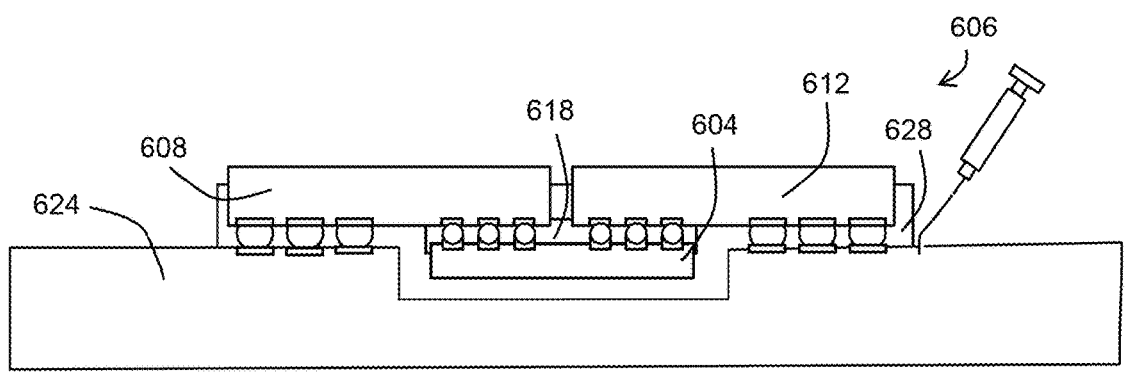
FIG. 6F is a schematic diagram depicting a DBHi silicon bridge package following the performance of a portion of the method shown in FIG. 5, in accordance with embodiments of the present disclosure.

In accordance with at least one embodiment of the present disclosure, operation 516 can further include sub-operation 516b, wherein the underfill material is dispensed. The underfill material fills gaps between and around the components of the chip-laminate sub-assembly by capillary action. FIG. 6F is a schematic drawing of the underfill material 628 and the chip-laminate sub-assembly 606 during performance of this portion of operation 516 in such embodiments.

In accordance with at least one embodiment of the present disclosure, operation 516 can further include sub-operation 516c, wherein the temperature of the chip-laminate sub-assembly is elevated to an underfill cure temperature to cure the underfill material once the underfill material has been dispensed. In accordance with at least one embodiment of the present disclosure, operation 516 can further include sub-operation 516d, wherein the chip-laminate sub-assembly is cooled back down to room temperature after the underfill material has been cured. In such embodiments, sub-operations 516c and 516d are performed under pressure. For example, these sub-operations can be performed under a pressure of between approximately 1 and approximately 7 atmospheres of pressure. In particular, these sub-operations can be performed under a pressure greater than approximately 1 atmosphere.

At operation 520, a lid, which may also be referred to as a cap, is attached to the underfilled chip-laminate sub-assembly to form an assembly. The assembly may be a DBHi package such as that shown in FIGS. 2A and 2B. In accordance with at least one embodiment of the present disclosure, operation 520 can include sub-operation 520a, wherein a seal is dispensed onto the laminate substrate in a location outside of the bridge-chip sub-assembly and thermal interface material (TIM) is dispensed onto the upwardly facing surfaces of the bridge-chip sub-assembly. In accordance with at least one embodiment of the present disclosure, operation 520 can further include sub-operation 520b, wherein the cap is placed on the chip-laminate sub-assembly, in particular, on the seal and TIM, to enclose the bridge-chip sub-assembly therein between the cap and the laminate substrate.

Figure 6G:
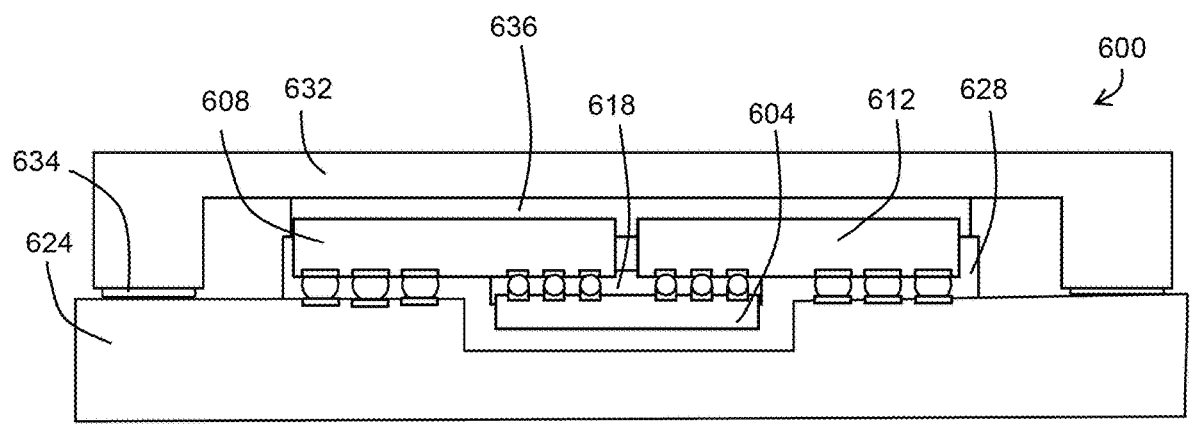
FIG. 6G is a schematic diagram depicting a DBHi silicon bridge package following the performance of a portion of the method shown in FIG. 5, in accordance with embodiments of the present disclosure.

FIG. 6G is a schematic drawing of the DBHi package 600, including the cap 632, the seal 634, and the TIM 636, following performance of operation 520.

In accordance with at least one embodiment of the present disclosure, operation 520 can further include sub-operation 520c, wherein a controlled temperature ramp up is performed to elevate the temperature of the assembly to a cure temperature at which the seal and TIM is cured. In accordance with at least one embodiment of the present disclosure, operation 520 can further include sub-operation 520d, wherein the seal and TIM are cured. In accordance with at least one embodiment of the present disclosure, operation 520 can further include sub-operation 520e, wherein a controlled temperature ramp down is performed to cool the temperature of the assembly from the cure temperature to room temperature.

The procedures and operations listed above provide an example of fabrication processes which may be used to form the DBHi package disclosed herein. In alternative embodiments of the present disclosure, the results of the procedures listed above, which are illustrated in FIGS. 6A-6G, can be achieved by the performance of other known procedures.

In accordance with at least one embodiment of the present disclosure, the NCP can be replaced with a non-conductive film (NCF). In such embodiments, in contrast with the NCP, which is applied at the chip-bridge level, the NCF is applied at the wafer level. More specifically, in accordance with at least one embodiment of the present disclosure, the NCF can be applied on the bridge wafer. In such embodiments, the NCF is applied on the bridge wafer, the bridge wafer is diced with the NCF, and the bridge is then attached to chips. Alternatively, in accordance with at least one embodiment of the present disclosure, the NCF can be applied on the chip wafers. In such embodiments, the NCF is selectively applied to pad regions of the chip wafer, the chip wafer is diced with the NCF, and the bridge is then attached to the chips. Such embodiments may further include creating a mask for a mixed pitch wafer with open areas for pads, dispensing the NCF, subsequently curing the NCF, and then laser cutting the NCF to leave the NCF only on the pads.

In accordance with at least one embodiment of the present disclosure, different NCP materials can be used on different chips. Such embodiments enable two different strengths on different sides of the bridge. Such an arrangement may be useful, for example, if the chips are differently sized, and therefore require connections of different strengths to the bridge. Such an arrangement may be useful, for example, if the chips are from different sources and have different fillet and/or flow control needs.

As discussed above, in the DBHi package 200 shown in FIGS. 2A and 2B, the end faces of the main chips 208, 212 are separated from each other by a relatively small gap. In accordance with at least one embodiment of the present disclosure, this gap can be filled with the NCP material 218 during the formation of the package 200, such as, for example in an operation similar to operation 508 of the illustrative method 500. In accordance with at least one embodiment of the present disclosure, this gap can be filled with the chip underfill 228 during the formation of the package 200, such as, for example in an operation similar to operation 516 of the illustrative method 500. In accordance with at least one embodiment of the present disclosure, this gap can be partially filled with the NCP material 218 and partially filled with the chip underfill 228. In accordance with at least one embodiment of the present disclosure, this gap can be filled with a material that is different from the NCP material 218 and different than the chip underfill 228.

In any of these embodiments, the one or more material(s) used to fill the gap is filled to a height that is less than the height of the uppermost surfaces of the chips. This arrangement is shown in FIG. 2A and in FIGS. 6F and 6G. Such embodiments facilitate connecting the chip-laminate sub-assembly with the cap when the TIM is cured. Additionally, in any of these embodiments, the coefficient of linear thermal expansion (CTE) of the one or more material(s) used to fill the gap can be specifically tailored. For example, the CTE can be tailored to be less than the CTE of silicon.

In accordance with at least one embodiment of the present disclosure, the DBHi package can further include a stiffener arranged between the cap and the laminate substrate. In such embodiments, the stiffener reduces mechanical stresses on the Cu pillars. For example, as shown in FIG. 7A, the DBHi package 700 includes at least one stiffener 750 arranged between the cap 732 and the laminate substrate 724 to reduce mechanical stresses on the Cu pillars 716. The DBHi package 700 is substantially similar to the DBHi package 200 described above and shown in FIG. 2A, except for the inclusion of the stiffener 750.

The stiffener 750 can be connected to the cap 732 by an adhesive and can be connected to the laminate substrate 724 by an adhesive. The adhesives can be the same or different. In accordance with at least one embodiment of the present disclosure, the stiffener 750 is attached to the laminate substrate 724 before or at the same time that the bridge-chip sub-assembly is attached to the laminate substrate 724.

As shown in FIGS. 7B, 7C, and 7D, the stiffener 750 can be provided in a number of different structures. For example, as shown in FIG. 7B, the stiffener 750 can be arranged on the laminate substrate 724 as a single structure surrounding the bridge 704 and chips 708, 712 in the manner of a frame. As another example, as shown in FIG. 7C, the stiffener 750 can be a plurality of independent L-shaped structures arranged around the bridge 704 and chips 708, 712. As another example, as shown in FIG. 7D, the stiffener 750 can be a plurality of independent bars arranged around the bridge 704 and chips 708, 712. Regardless of the structure of the stiffener 750, the stiffener 750 is arranged so as to reduce mechanical stresses on the Cu pillars.

In accordance with at least one embodiment of the present disclosure, the DBHi package can further include a laminate substrate having a beveled trench edge. More specifically, in such embodiments, the top edge of the trench, where the trench is formed in the top surface of the laminate substrate, is formed at an angle that is not perpendicular to either the side wall of the trench or the top surface of the laminate substrate. In such embodiments, this beveled trench edge facilitates easier underfill flow and reduces voids in the underfill that may be caused by an interference of sharp edges with capillary action.

Figure 8:
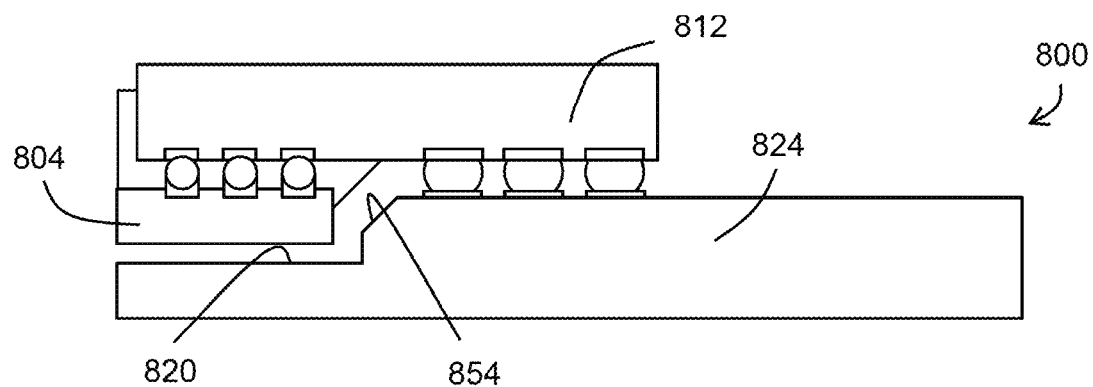
FIG. 8 is a schematic diagram depicting a portion of a DBHi silicon bridge package, in accordance with embodiments of the present disclosure.

For example, as shown in FIG. 8, the DBHi package 800 includes a laminate substrate 824 having a beveled trench edge 854. In accordance with at least one embodiment of the present disclosure, the laminate substrate 824 is formed such that a gap between the side wall of the trench 820 and the edge of the bridge 804 is at least approximately 400 micrometers wide below the bottom of the beveled edge 854. In accordance with at least one embodiment of the present disclosure, the laminate substrate 824 is formed such that a distance between the top of the beveled edge 854 and the edge of the first pad on the laminate substrate 824 is approximately half of the C4 pitch.

In accordance with at least one embodiment of the present disclosure, the DBHi package can include protruding metallic structures in the bridge-chip interfaces. More specifically, either the chips or the bridge can include protruding metallic structures each of which has a point configured to pierce solder to reduce entrapment of NCP materials during the formation of the DBHi package.

Figure 9A:
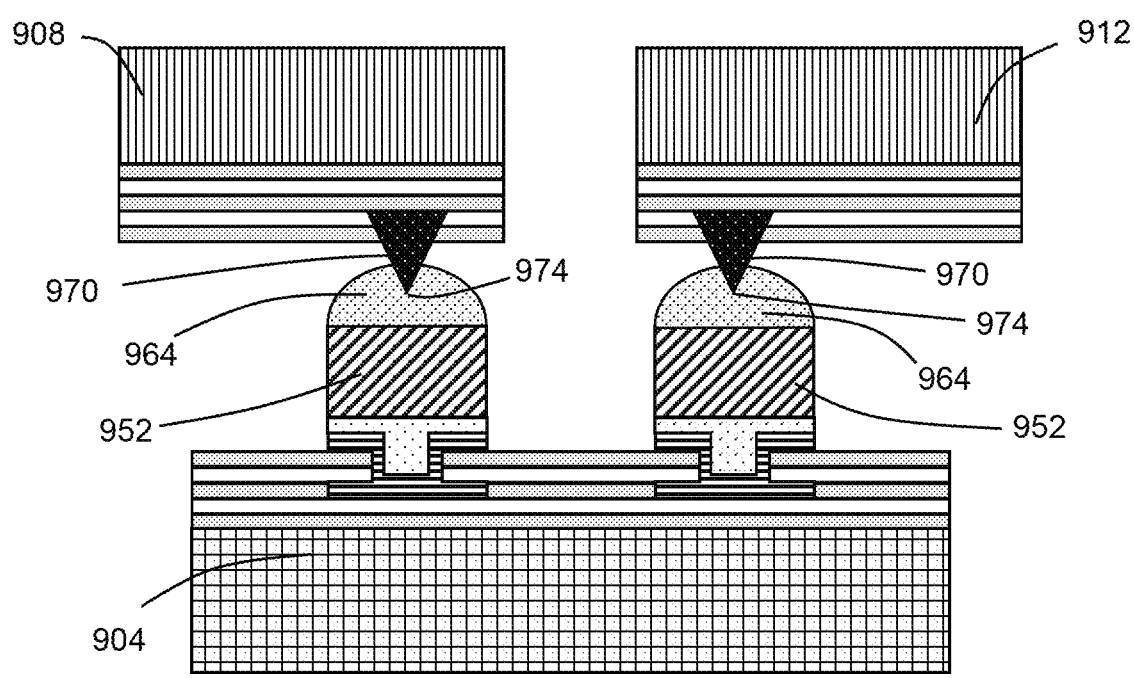
FIG. 9A is a schematic cross-section view depicting a portion of a DBHi silicon bridge package, in accordance with embodiments of the present disclosure.
Figure 9B:
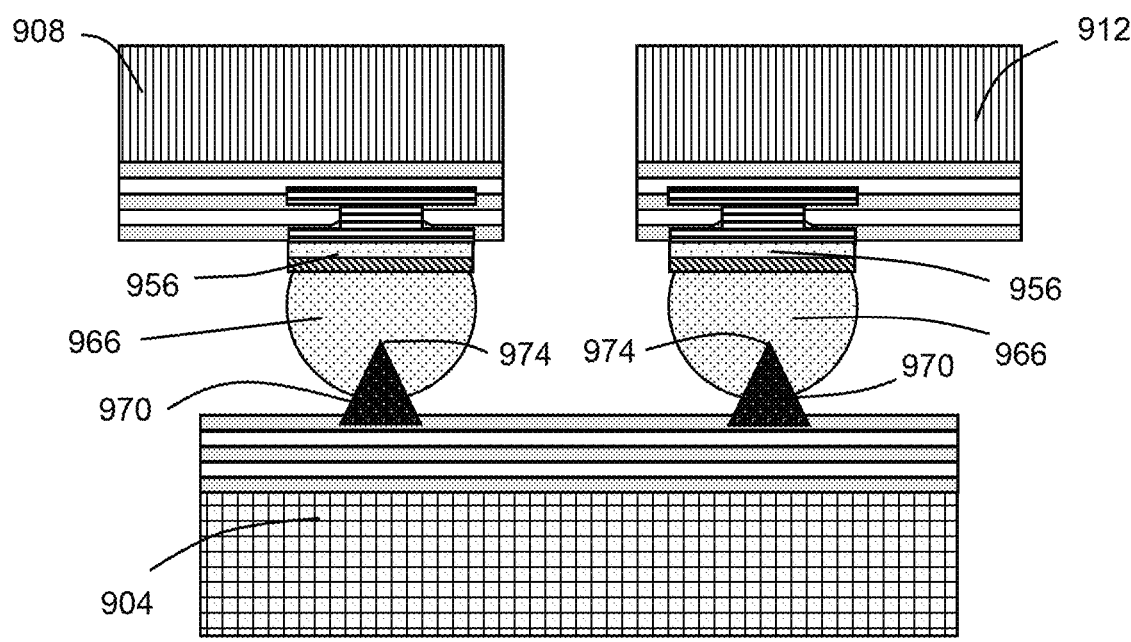
FIG. 9B is a schematic cross-section view depicting a portion of a DBHi silicon bridge package, in accordance with embodiments of the present disclosure.
Figure 9C:
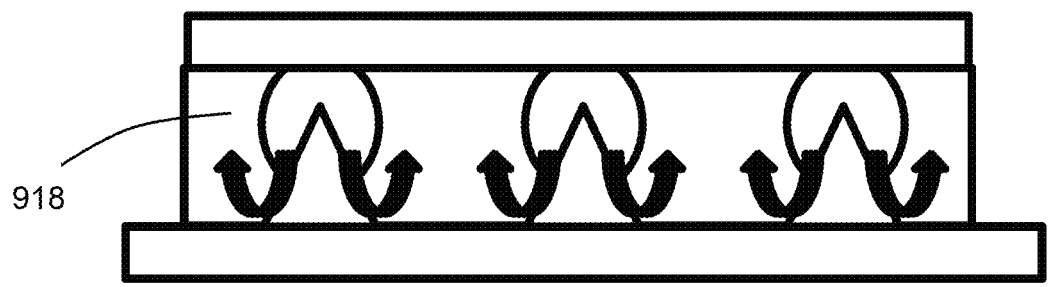
FIG. 9C is a schematic diagram depicting an effect produced by a DBHi silicon bridge package, such as that shown in FIG. 9A or FIG. 9B, in accordance with embodiments of the present disclosure.

For example, as shown in FIG. 9A, each of the chips 908 and 912 includes protruding metallic structures 970. Each protruding metallic structure 970 includes a point 974 configured to pierce solder 964 of a corresponding Cu pillar 952 on the bridge 904. In contrast, as shown in FIG. 9B, the bridge 904 includes protruding metallic structures 970, each of which has a point 974 configured to pierce solder 966 of a corresponding interconnect 956 on the chips 908, 912. Regardless of whether the protruding metallic structures 970 are included on the bridge 904 or the chips 908, 912, their effect is illustrated in FIG. 9C, wherein the flow (indicated by the curved arrows) of NCP materials 918 around the Cu pillars or interconnects is facilitated, thereby reducing entrapment of NCP materials 918 during the formation of the DBHi package.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications, alterations, and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Additionally, it is intended that the following claim(s) be interpreted as covering all such alterations and modifications as fall within the true spirit and scope of the invention.

What is claimed is:

1. A direct bonded heterogeneous integration (DBHi) device, the DBHi device comprising:
 a substrate including a trench formed in a top surface of the substrate;
 a first chip coupled to the substrate on a first side of the trench by a plurality of first interconnects;
 a second chip coupled to the substrate on a second side of the trench by a plurality of second interconnects, the second side of the trench arranged opposite the first side of the trench;
 a bridge coupled to the first chip and to the second chip by a plurality of third interconnects such that the bridge is suspended in the trench;
 a non-conductive paste material surrounding the plurality of third interconnects to further couple the bridge to the first chip and to the second chip; and an underfill material surrounding the plurality of first interconnects, the plurality of second interconnects, the bridge, and the non-conductive paste material.

2. The DBHi device of claim 1, wherein:
the underfill material is different from the non-conductive paste material.

3. The DBHi device of claim 1, further comprising:
a cap configured to enclose the first chip, the second chip, and the bridge when coupled to the substrate; and
at least one stiffener arranged between the cap and the substrate such that the bridge is indirectly coupled to the substrate via the at least one stiffener.

4. The DBHi device of claim 1, wherein:
the trench extends downwardly into the substrate from the top surface of the substrate to a trench depth;
the substrate includes a core layer arranged at a core depth beneath the top surface of the substrate; and
the trench depth is less than the core depth.

5. The DBHi device of claim 1, wherein:
the trench includes a side wall arranged substantially parallel to a side surface of the bridge;
the trench includes an edge arranged between the side wall and the top surface of the substrate; and
the edge includes a beveled surface that is not parallel to the side wall of the trench and is not parallel to the top surface of the substrate.

6. The DBHi device of claim 1, wherein:
at least one of the first chip and the second chip includes at least one pointed projection arranged such that the at least one pointed projection is aligned with a corresponding third interconnect when the bridge is coupled to the first chip and to the second chip; and
the at least one pointed projection is configured to pierce solder arranged on the corresponding third interconnect when the bridge is coupled to the first chip and to the second chip.

7. The DBHi device of claim 1, wherein:
the bridge includes at least one pointed projection arranged such that the at least one pointed projection is aligned with one of a corresponding first interconnect and a corresponding second interconnect when the bridge is coupled to the first chip and to the second chip; and
the at least one pointed projection is configured to pierce solder arranged on the one of the corresponding first interconnect and the corresponding second interconnect when the bridge is coupled to the first chip and to the second chip.

8. The DBHi device of claim 1, wherein:
a length of the bridge is defined by a dimension of the bridge extending over a gap between the first chip and the second chip, over a portion of the first chip, and over a portion of the second chip; and
the length of the bridge is determined by a length of the gap, a distance from the gap to a farthest third interconnect coupled to the first chip, a distance from the gap to a farthest third interconnect coupled to the second chip, a distance from the farthest third interconnect coupled to the first chip to a first adjacent first interconnect, and a distance from the farthest third interconnect coupled to the second chip to a first adjacent second interconnect.

9. The DBHi device of claim 1, wherein:
the non-conductive paste material includes a first material surrounding the plurality of third interconnects that couple the bridge to the first chip; and the non-conductive paste material includes a second material surrounding the plurality of third interconnects that couple the bridge to the second chip.

10. A direct bonded heterogeneous integration (DBHi) device, the DBHi device comprising:
a substrate;
a first chip coupled to the substrate by a plurality of first interconnects;
a second chip coupled to the substrate by a plurality of second interconnects;
a bridge coupled to the first chip and to the second chip by a plurality of third interconnects;
a non-conductive paste material surrounding the plurality of third interconnects to further couple the bridge to the first chip and to the second chip; and
an underfill material surrounding the plurality of first interconnects, the plurality of second interconnects, the bridge, and the non-conductive paste material, wherein the underfill material is different from the non-conductive paste material, wherein:
each of the plurality of first interconnects is separated from one another by a first pitch,
each of the plurality of third interconnects is separated from one another by a third pitch, and
the first pitch is different than the third pitch.

11. The DBHi device of claim 10, wherein:
each of the plurality of second interconnects is separated from one another by a second pitch; and
the third pitch is different than the second pitch.

12. The DBHi device of claim 10, wherein:
the substrate includes a trench formed in a top surface of the substrate; and
the bridge is suspended in the trench such that the bridge does not directly contact the substrate.

13. A method of forming a direct bonded heterogeneous integration (DBHi) device, the method comprising:
joining a bridge to a first chip, including:
dispensing a non-conductive paste on the first chip,
thermocompression bonding the bridge to the non-conductive pasted first chip; and
curing the non-conductive paste on the thermocompression bonded first chip; and
joining the bridge to a second chip, including:
dispensing a non-conductive paste on the second chip;
thermocompression bonding the bridge to the non-conductive pasted second chip; and
curing the non-conductive paste on the thermocompression bonded second chip,
wherein joining the bridge to the first chip and to the second chip forms a bridge-chip sub-assembly.

14. The method of claim 13, wherein:
the non-conductive paste on the first chip is different than the non-conductive paste on the second chip.

15. The method of claim 13, further comprising:
performing a formic acid reflow on the bridge-chip sub-assembly; and
joining the bridge-chip sub-assembly to a substrate to form a chip-laminate sub-assembly.

16. The method of claim 13, further comprising:
underfilling the chip-laminate sub-assembly with an underfill material; and
curing the underfill material under a pressure greater than atmospheric pressure.

17. The method of claim 16, wherein:
underfilling the chip-laminate sub-assembly includes cooling the chip-laminate sub-assembly to an underfill dispense temperature; and the underfill dispense temperature is the highest temperature at which a viscosity of the underfill material is approximately 50% of its minimum value as a function of temperature.

* * * * *